United States Patent [19]
Leighton et al.

[11] Patent Number: 5,804,867
[45] Date of Patent: Sep. 8, 1998

[54] THERMALLY BALANCED RADIO FREQUENCY POWER TRANSISTOR

[75] Inventors: Larry Leighton, Santa Cruz, Calif.; Ted Johansson, Djursholm; Bertil Skoglund, Sollentuna, both of Sweden

[73] Assignee: Ericsson Inc., Morgan Hill, Calif.

[21] Appl. No.: 720,574

[22] Filed: Oct. 2, 1996

[51] Int. Cl.$^6$ .................................................. H01L 27/102
[52] U.S. Cl. .......................... 257/580; 257/579; 257/582; 257/587
[58] Field of Search .................................... 257/580, 581, 257/578, 579, 582, 587, 588

[56] References Cited

U.S. PATENT DOCUMENTS

| | | | |
|---|---|---|---|
| Re. 26,803 | 2/1970 | Wolf | 317/101 |
| 3,225,261 | 12/1965 | Wolf | 317/101 |
| 3,600,646 | 8/1971 | Brackelmanns et al. | 317/234 |
| 3,896,475 | 7/1975 | Bonis | 257/529 |
| 4,091,409 | 5/1978 | Wheatley, Jr. | 257/580 |
| 4,161,740 | 7/1979 | Frey | 357/36 |
| 4,682,197 | 7/1987 | Villa et al. | 357/36 |
| 4,769,688 | 9/1988 | Cotton | 357/36 |
| 5,023,189 | 6/1991 | Bartlow | 437/8 |
| 5,107,326 | 4/1992 | Hargasser | 257/579 |
| 5,210,439 | 5/1993 | Conzelmann et al. | 257/587 |
| 5,317,176 | 5/1994 | Schaper et al. | 257/287 |
| 5,488,252 | 1/1996 | Johansson et al. | 257/579 |

FOREIGN PATENT DOCUMENTS

| | | |
|---|---|---|
| 02026033 | 1/1990 | European Pat. Off. . |
| 0 560 123 A2 | 2/1993 | European Pat. Off. . |
| 0 716 456 A1 | 12/1995 | European Pat. Off. . |
| 2-26033 | 1/1990 | Japan . |
| 3-131038 | 6/1991 | Japan ....................... 257/582 |
| 6-037098 | 2/1994 | Japan ....................... 257/579 |
| WO 96/14665 | 5/1996 | WIPO . |

*Primary Examiner*—Tom Thomas
*Assistant Examiner*—David B. Hardy
*Attorney, Agent, or Firm*—Lyon & Lyon LLP

[57] ABSTRACT

An RF power transistor having improved thermal balance characteristics includes a first emitter electrode and a base electrode formed on a silicon die, each having a multiplicity of parallel electrode fingers. A second emitter electrode is formed over the base electrode, and is electrically connected to the first emitter electrode. Ballast resistors are formed in a substantially evenly spaced manner on each side the silicon die, in series with at least some of the electrode fingers of the first emitter electrode and in series of at least some of the electrode fingers of the second emitter electrode.

5 Claims, 3 Drawing Sheets

THERMALLY BALANCED RADIO FREQUENCY POWER TRANSISTOR

BACKGROUND OF THE INVENTION

1. Field of the Invention

The present invention pertains to radio frequency (RF) power transistors.

2. State of the Art

Radio frequency (RF) power transistors are commonly used in amplification stages for radio base station amplifiers. Such transistors are also widely used in other RF-related applications, such as, e.g., cellular telephones, paging systems, navigation systems, television, avionics, and military applications.

Such transistor devices are typically formed by one or more transistor cells fabricated on a silicon wafer, referred to as a transistor "chip". The transistor chip is then attached to an insulating layer, normally a ceramic substrate. The ceramic substrate is itself attached to a mounting flange, and a protective cover is placed over the substrate and transistor chip, thereby forming a component transistor "package." Various electrically conductive (e.g., metal) leads are attached to, and extend away from the package (i.e., outside the protective cover) to connect common terminals of the transistor chip to external circuit elements, e.g., located in a pc board along with the transistor package. For example, in a bipolar junction type transistor, respective electrical leads attached to the package are connected to a base, emitter and collector of the transistor chip.

RF power transistors used for power amplification at high frequencies need to meet numerous detailed requirements for output power, gain, ruggedness, efficiency, stability, bandwidth, etc., and at a specified supply voltage and operating frequency. For example, the operating frequencies for modern telecommunication electronics range from several hundred megahertz ("MHz"), up into the microwave region. The output power requirements for such high frequency transistors may range from a few watts up to several hundred watts, often employing many paralleled transistor chips in a single package. Further, such high frequency power transistors may often operate at large signal levels and high current densities. Computer modeling tools presently available are often not sufficient to predict detailed behavior or performance of the transistors being used in such applications.

In use, RF transistors will often dissipate significant heat and localized hot spots can develop. If the temperatures of the hot spots rise too high, the electrical characteristics of the transistor may change, leading to degraded performance. Under more extreme conditions, areas of the semi-conductor material forming the transistor can melt, causing permanent degraded performance, or even complete failure of the device. Accordingly, the thermal or heat dissipation performance of RF power transistors must be carefully considered. Indeed, an ongoing challenge in the design of RF transistors is achieving better thermal balance. Thermal balance refers to how heat is distributed in the transistor package. Designs that have better thermal balance generally suffer less from the effects of hot spots. While the principles of achieving better thermal balance suggest the use of a uniform arrangement of heat dissipating elements within the transistor, the electrical characteristics of a transistor often have conflicting needs. For example, the electrical characteristics of a transistor layout may require the location of several heat dissipating elements relatively close together.

Because of thermal instability and heat dissipation effects, various techniques have been used to more evenly distribute the current flow in the transistor. One such technique is to add electrical resistance to each segment of the transistor, such that an increase in current through a particular emitter will be limited by the resistor. This technique is known as emitter ballasting. For example, a conventional power transistor layout is shown in FIG. 1, wherein a plurality of respective ballasting resistors $R_e$ are formed in series with a plurality of respective electrode fingers F of an emitter electrode E, either by diffusion, ion implantation, or deposition of a suitable metal—e.g., nickel-chromium (NiCr)—on top of a silicon dioxide layer (not shown). The transistor also includes a plurality of the respective electrode fingers G of a base electrode formed on the silicon dioxide layer, wherein the respective emitter and base electrode fingers are interdigitated.

While emitter ballasting of the type shown in FIG. 1 is generally effective in preventing thermal runaway, it does not necessarily achieve a highly uniform thermal distribution. More particularly, as can be seen from a cross-section of the transistor cell taken across a respective emitter finger F shown in FIG. 2, two heat conduction sources are present. A first heat source is the active area of the transistor cell itself, designated as "AA". A second heat source is the respective ballast resistor $R_e$. Each of these heat sources conducts heat downwardly into the silicon substrate in a conical pattern, commonly referred to as a heat cone, "HC". For purposes of illustration, the heat cone from the active area AA of the transistor cell is designated as $HC_{AA}$, and the heat cone from the respective ballast resistor $R_e$ is designated as $HC_{Re}$.

As can be observed in FIG. 2, because the respective heat cone $HC_{Re}$ generated by the emitter ballast resistor $R_e$ is generally less than that generated by the active transistor cell area, $HC_{AA}$ the overall heat distribution of the respective heat cones, $HC_{AA}$ and $HC_{Re}$, is non-uniform with respect to the symmetry of the overall geometry formed on the silicon layer, thereby causing adverse effects due to uneven heat distribution, such as hot spots.

Accordingly, there is a need for RF power transistors having improved thermal balance, and more uniform heat distribution.

SUMMARY OF THE INVENTION

The present invention overcomes the aforedescribed limitations of prior art thermal balance and heat distribution techniques by providing a RF power transistor design such that the generated heat output is made more uniform, thereby reducing hot spots and providing a substantially uniform heat distribution.

In an exemplary preferred embodiment, an RF power transistor includes a silicon die having a first emitter electrode formed thereon along a first edge of the transistor and a base electrode formed thereon along an opposing edge, respectively, each respective electrode having a multiplicity of parallel, interdigitated electrode fingers. In accordance with a first aspect of the present invention, a second interdigitated emitter electrode is formed underneath the base electrode—i.e., spaced apart from, and opposing the first emitter electrode—wherein the first and second emitter electrodes are electrically connected. Ballast resistors are formed on the silicon die in series with the electrode fingers of both the first and second emitter electrodes, wherein the ballasting resistors are uniformly and symmetrically distributed along the respective sides of the transistor cell boundaries. In this manner, symmetrically balanced heat cones are generated on opposing sides of the active area of the transistor cell, thereby providing a substantially uniform heat distribution.

In accordance with yet another aspect of the invention, by locating the second emitter electrode underneath the base electrode, the second emitter electrode substantially reduces the collector-base capacitance of the transistor, which can also impact negatively on performance.

This and other aspects, objects, advantages and features of the present invention will be more fully understood and appreciated by those skilled in the art upon consideration of the following detailed description of a preferred embodiment, presented in conjunction with the accompanying drawings.

BRIEF DESCRIPTION OF THE DRAWINGS:

The drawings illustrate both the design and utility of a preferred embodiment of the present invention, in which.

DETAILED DESCRIPTION OF THE DRAWINGS

Figure 3:
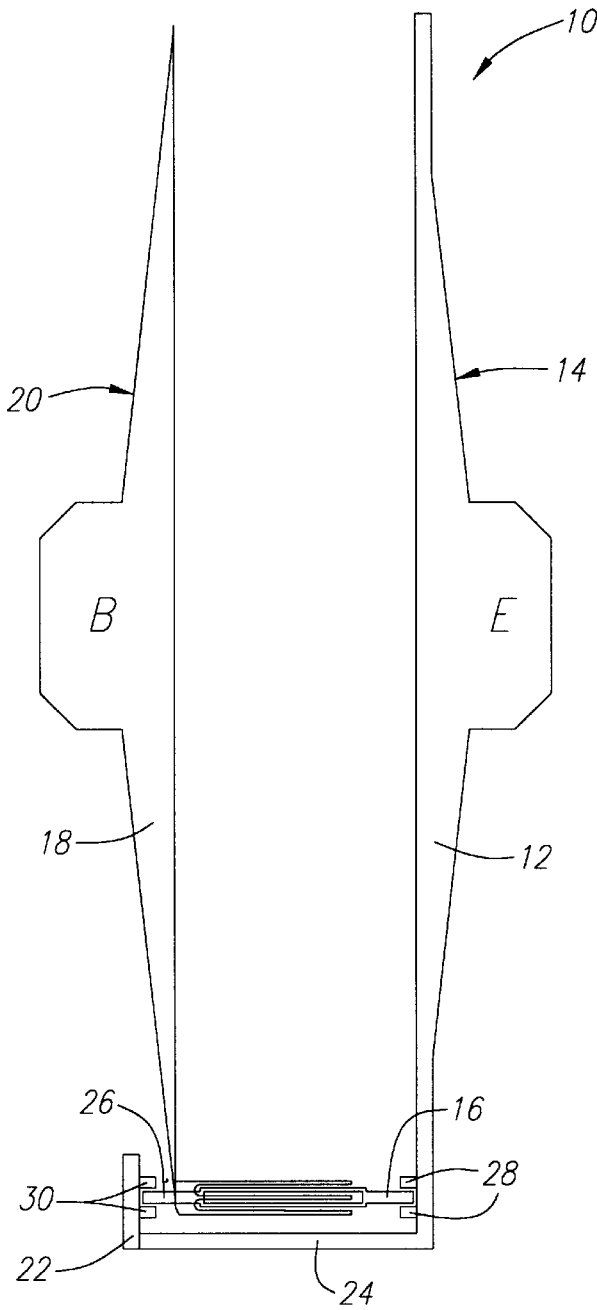
FIG. 3 is a simplified plan view of a preferred interdigitated RF power transistor geometry, in accordance with the present invention.
Figure 5:
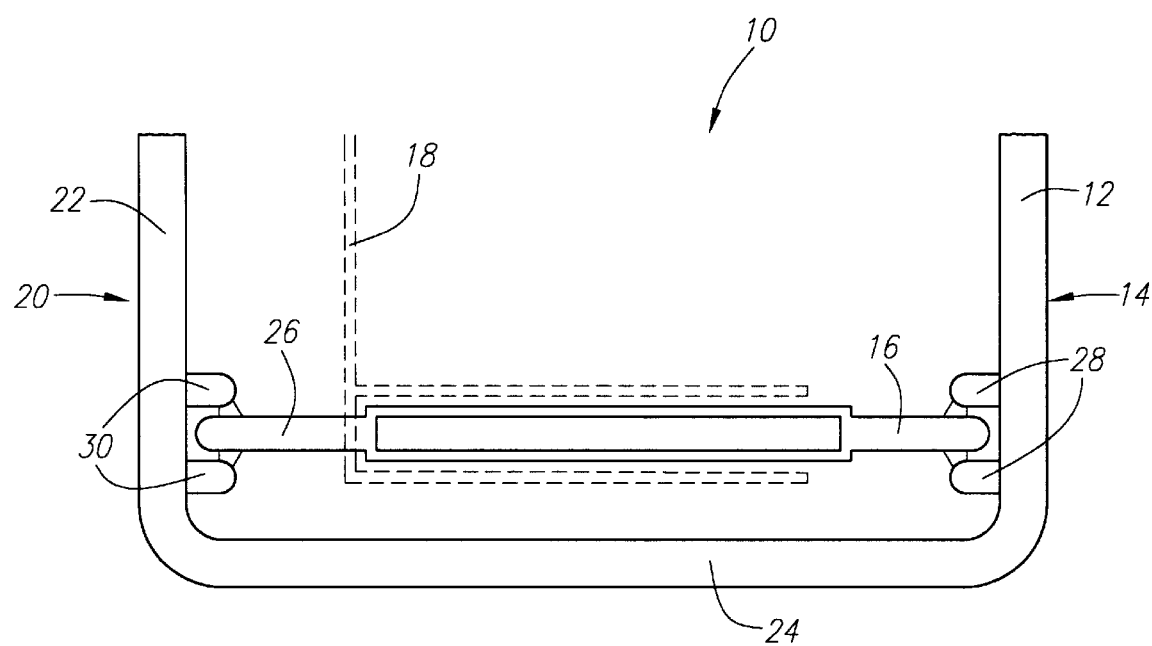
FIG. 5 is a simplified enlarged view of a portion of the preferred transistor of the FIG. 3.

Referring to FIGS. 3 and 5, a preferred RF power transistor cell 10 formed on a silicon die (not shown) has a first interdigitated emitter electrode 12 formed along a first side 14. The first emitter electrode 12 has a plurality of electrode fingers 16 formed in a known geometry, such as that shown in FIG. 1. For purposes of clarity, only a single electrode finger 16 is shown. A base electrode 18 is formed along a second side 20 of the transistor cell 10, also having a plurality of electrode fingers (shown as dashed lines in FIG. 5) formed in a known geometry, such as that shown in the transistor cell of FIG. 1.

In accordance with a general aspect of the invention, a second interdigitated emitter electrode (partially shown) 22 is formed Underneath the base electrode 18—i.e., spaced apart from the first emitter electrode 12 along the second side 20 of the transistor cell 10. The second emitter electrode 22 is electrically connected to the first emitter electrode 12 by a conductor 24. The second emitter electrode 22 also has a plurality of electrode fingers 26 formed in the same way as the first emitter electrode 12—i.e., in a known geometry such as that shown in the transistor cell of FIG. 1. Again, however, for purposes of clarity, only a single finger 26 of the second emitter electrode 22 is shown. The second emitter electrode 22 preferably extends along the entire length of the transistor cell 10—i.e., coextensive with the length of the first emitter electrode 12—although FIGS. 3 and 5 show only a lower segment.

Also formed on the first side 14 of the transistor cell 10 are a plurality of ballast resistors 28, which are connected to, or otherwise formed in series with, the respective first emitter electrode fingers 16. Similarly, formed on the second side 20 of transistor cell 10 are a further plurality of ballast resistors 30, which are connected to, or otherwise formed in series with, respective second emitter electrode fingers 26. The respective pluralities of ballast resistors 28 and 30 are preferably uniformly and symmetrically distributed along the entire length of the respective sides of the transistor cell 10.

Figure 1:
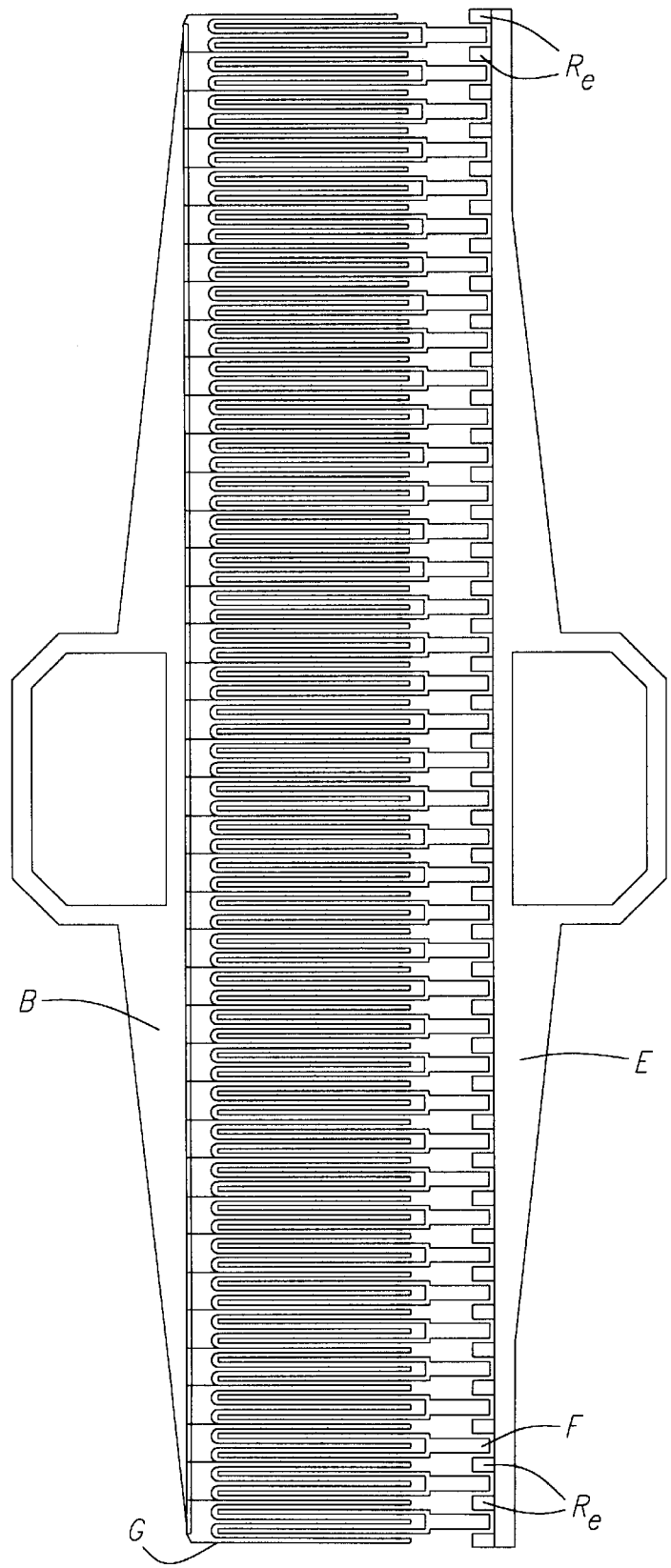
FIG. 1 is a plan view of a known interdigitated RF power transistor geometry, illustrating a conventional ballasting resistor arrangement.
Figure 2:
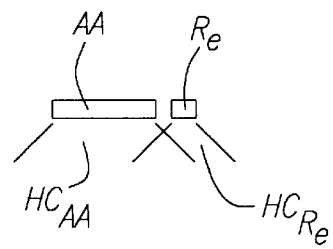
FIG. 2 is a diagram of the heat conduction pattern produced along a cross section of the transistor of FIG. 1.

Unlike the known transistor cell of FIG. 1, where the respective base and emitter electrodes are typically formed using a single metal layer, the base electrode 18 and the second emitter electrode 22 cannot be formed from the same metal layer, since they are overlapping. Instead, two metal layers are used—i.e., one metal layer for the base electrode 18 and another metal layer for the respective first and second emitter electrodes 12 and 22.

Figure 4:
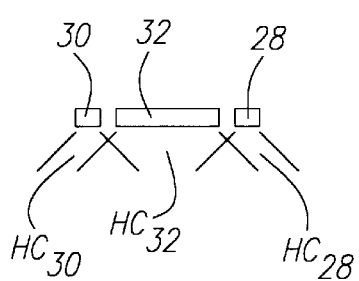
FIG. 4 is a diagram of the heat conduction pattern produced along a cross section of the preferred transistor of FIG. 3.

FIG. 4 shows the heat conduction pattern produced along a cross section of the transistor cell 10, that is, through the active area 32 of the transistor cell and the respective emitter ballast resistor sites 28 and 30. As can be observed, heat from the emitter ballast resistors 28 and 30 is symmetrically conducted along opposite sides of the active transistor area 32. In particular, respective heat cones $HC_{28}$ and $HC_{30}$ from the respective ballast resistor sites 28 and 30 are evenly spaced along the opposing sides of the heat cone $HC_{32}$ formed by the heat generated from the active transistor cell area 32. Thus, the overall heat distribution of the transistor 10 is more uniform.

A further advantage of the afore-described preferred embodiment is that the second emitter electrode 22 effectively inserts a "metal plate" between the base electrode 18 and a collector layer (not shown) underlying the transistor cell 10. This reduces, if not eliminates, the negative impact of the capacitance otherwise formed between the base and collector electrodes.

It will be appreciated by those of ordinary skill in the art that the invention can be embodied in other specific forms without departing from the spirit or essential character thereof. The presently disclosed embodiment therefore, should be considered as illustrative and not restrictive.

The invention should accordingly not be limited, except by the scope of the following claims and their equivalents.

What is claimed:

1. An RF power transistor comprising:

a silicon die;

a first emitter electrode formed on a first side of the die and comprising a first plurality of emitter fingers;

a base electrode formed on a second side of the die;

a second emitter electrode formed on the second side of the die and comprising a second plurality of emitter fingers, the second emitter electrode electrically connected to the first emitter electrode, wherein a respective emitter finger of the first plurality of emitter fingers and a respective emitter finger of the second plurality of emitter fingers collectively form a common active emitter region;

a first plurality of ballast resistors formed on the first side of the die, and electrically connected to the first emitter electrode; and a second plurality of ballast resistors formed on the second side of the die, and electrically connected to the second emitter electrode.

2. The transistor of claim 1, wherein the first and second emitter electrodes are formed on a first metal layer and the base electrode is formed on a second metal layer.

3. In an RF power transistor having respective interdigitated first emitter and base electrodes formed on opposing sides of a silicon die, and of the type using emitter ballasting by employing one or more resistors in series with one or more respective emitter fingers of the first emitter electrode, the improvement comprising:

a second emitter electrode spaced apart from, and electrically connected with, the first emitter electrode, the second emitter electrode including a plurality of emitter fingers; and one or more ballast resistors connected in series with respective emitter fingers of the second emitter electrode, wherein a ballast resistor connected in series with a respective emitter finger of the first emitter electrode is electrically connected with a respective ballast resistor connected in series with an emitter finger of the second emitter electrode.

4. The transistor of claim 3 wherein the transistor comprises a rectangular cell and the respective ballast resistors are substantially symmetrically distributed along the entire length of opposing cell boundaries running lengthwise of the transistor.

5. In an RF power transistor having respective interdigitated first emitter and base electrode layers formed on opposing sides of a silicon die and a common collector layer formed at least in part under the base electrode layer, a method for reducing the capacitance of the power transistor comprising:

forming a second emitter electrode layer between the respective base electrode and common collector layers, wherein the first and second emitter electrode layers are electrically connected to form a common active emitter region.

\* \* \* \* \*